United States Patent [19]

Swanson

[11] Patent Number: 4,570,080
[45] Date of Patent: Feb. 11, 1986

[54] CORRECTED SAMPLE-AND-HOLD CIRCUIT

[75] Inventor: Eric J. Swanson, Reading, Pa.

[73] Assignee: AT&T Bell Laboratories, Murray Hill, N.J.

[21] Appl. No.: 540,277

[22] Filed: Oct. 11, 1983

[51] Int. Cl.[4] .................. G11C 27/02; H03K 17/14
[52] U.S. Cl. ................................. 307/353; 328/151
[58] Field of Search ............... 307/353, 352; 328/151; 333/165, 166

[56] References Cited

U.S. PATENT DOCUMENTS 4,004,157  1/1977  Baertsch et al. ............... 307/353
4,262,258  4/1981  Gaalema ......................... 307/353

Primary Examiner—John Zazworsky
Attorney, Agent, or Firm—Volker R. Ulbrich

[57] ABSTRACT

An electronic sample-and-hold circuit (10, 24) of the type which includes a correction network is designed to eliminate a primary signal feedback loop. A correction capacitor, ($C_C$), a coupling capacitor ($C_{CC}$), and a primary holding capacitor ($C_H$) are connected in series, respectively, between two ground points. The common node of the coupling capacitor and the holding capacitor is a held signal node (12). The common node of the coupling capacitor ($C_{CC}$) and the correction capacitor ($C_C$) is a correction voltage node (20). The circuit output is from the signal node (12) through a buffer (14) and a stage selecting switch ($S_F$). The output is fed back to an operational amplifier (18, 26) which has its output connected to the correction node (20) through a correction sampling switch ($S_C$). A switched ($S_A$) feedback loop connects the output of the amplifier 18 to the inverting input port. The primary signal input (IN) is to the signal node (12) through a primary sampling switch ($S_S$). The noninverting input (+) of the amplifier (26) is connected to the output of a buffer (22). The input of the buffer (22) receives the input signal through an input switch ($S_I$) and is also connected to an input capacitor ($C_I$), which has its other side grounded.

Also disclosed is a circuit (24) in which the operational amplifier (26) is a less complex, inverting amplifier provided with a switched ($S_A$) local bypass loop.

3 Claims, 3 Drawing Figures

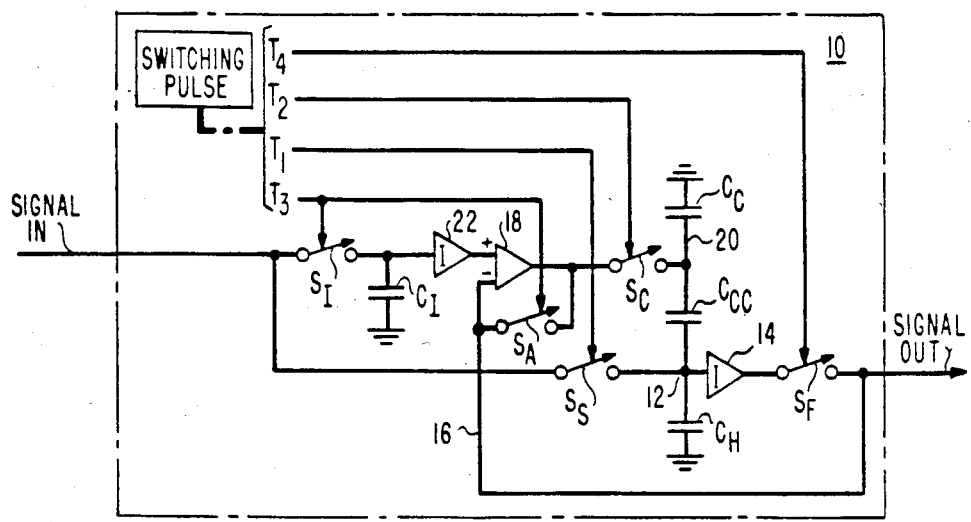
FIG. 1
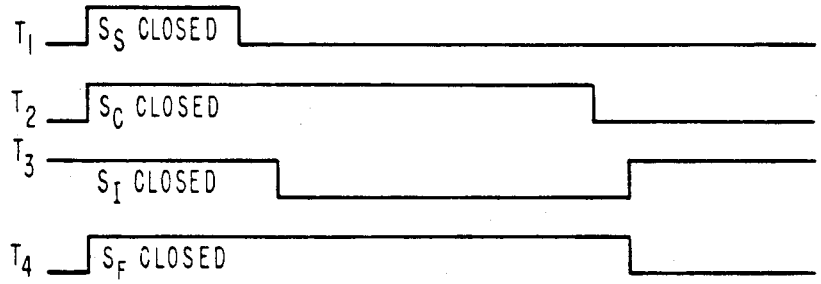
FIG. 2  TIMING DIAGRAM
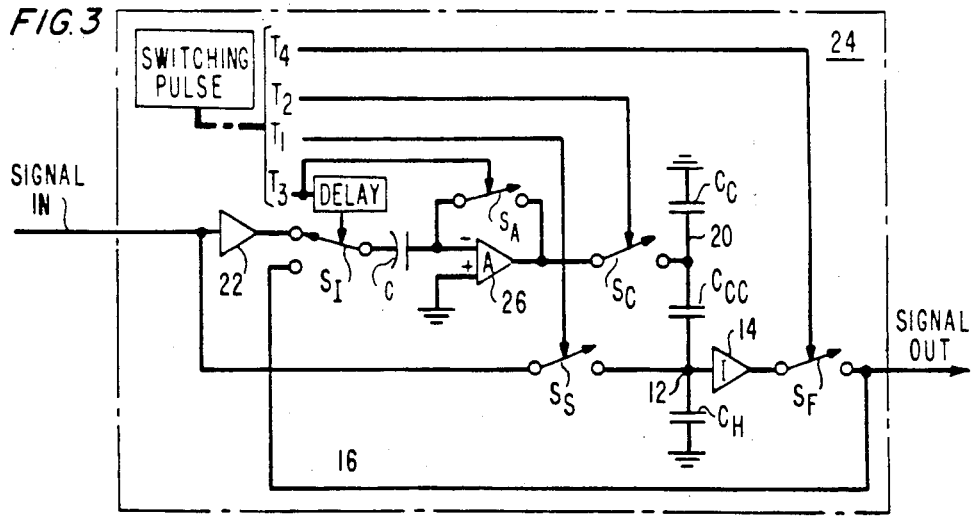
FIG. 3

CORRECTED SAMPLE-AND-HOLD CIRCUIT

FIELD OF THE INVENTION

The invention relates generally to electronic sample-and-hold circuits and relates more particularly to such circuits designed as a plurality of stages in a transversal filter bank for use in an integrated circuit of the MOS (metal-oxide-semiconductor) type.

BACKGROUND OF THE INVENTION

In a simple sample-and-hold circuit a sampling switch momentarily connects one side of a holding capacitor to a signal voltage level. The other side of the capacitor is connected to a reference potential, typically ground potential. This stored signal voltage may then be used as an input to other circuits as desired. Naturally, it is desirable that the stored voltage accurately reflect the actual signal voltage. A significant problem arises when the circuit is implemented with MOS devices, since MOS transistors which are used as the sampling switch are known to introduce an error charge feedthrough as they open up. One way to reduce this effect has been to use the MOS devices in parallel complementary pairs, so that the feedthrough charges are largely canceled. The input signal is supplied to the switch through an operational amplifier. A feedback loop connected to the stored signal node of the storage capacitor via a buffer loops back to the inverting input of the operational amplifier, thereby forming what is commonly referred to as a "feedback sample-and-hold circuit."

When sample-and-hold circuits are used as stages in a transversal filter bank, the accuracy with which each stage stores the signal voltage becomes especially critical. Variations among the stages results in a fixed pattern noise in the output signal from the bank which is very difficult, if not impossible, to remove by filtering. Further improvements in the accuracy have been gained by the use of a switched secondary feedback correction network. Dual feedback circuits of this type are described, for example, in copending application Ser. No. 426,293, entitled "Switched Capacitor Feedback Sample-and-Hold Circuit", filed Sept. 29, 1982 now abandoned in favor of a continuation application, Ser. No. 662,245, filed Oct. 18, 1984, and application Ser. No. 451,026, entitled "Switched Capacitor Feedback Sample-and-Hold Circuit", filed Dec. 20, 1982, which are assigned to the same assignee as is the present invention.

There remains a problem which relates to spurious stacking faults which sometimes appear to varying degrees in the switching devices. Such faults appearing in the sampling switch devices lead to unpredictable leakage of charge from the holding capacitor to the substrate. Reducing the size of the switch devices to reduce the leakage is not an option, since they are already small to minimize the effects of parasitic capacitances. Nor is it feasible to simply increase the value of the storage capacitor, because this capacitor is part of the primary feedback loop and cannot be increased without rendering the loop unstable.

SUMMARY OF THE INVENTION

The novel sample-and-hold circuit in accordance with the present invention includes a correction network which relies on feedback through an operational amplifier, but does not include a primary feedback loop for charging the holding capacitor. The holding capacitor is charged directly from the signal input to the circuit. This eliminates the stability problem with the primary feedback loop and thereby permits the value of the holding capacitor to be increased sufficiently to reduce the effects of leakage by the sampling switch.

BRIEF DESCRIPTION OF THE DRAWINGS

FIG. 1 is a simplified schematic diagram of a corrected sample-and-hold circuit in accordance with one embodiment of the present invention.

FIG. 2 is a greatly exaggerated timing diagram showing the timing and sequence of operation of the electronic switches of the circuit of FIG. 1.

FIG. 3 is a simplified schematic diagram of a corrected sample-and-hold circuit in accordance with another embodiment of the invention in which there is used an inverting operational amplifier in place of the operational amplifier of the circuit of FIG. 1.

DETAILED DESCRIPTION

The circuit 10 of FIG. 1 is a corrected sample-and-hold circuit in accordance with one embodiment of the invention. It is useful alone, but is especially suited as one of a plurality of stages of a transversal filter bank. The general interconnection and interaction of stages of a bank is known and is discussed, for example, in the above-mentioned pending applications.

In the circuit 10, three capacitors $C_C$, $C_{CC}$, $C_H$ are connected in series, respectively, between two ground potential points. The capacitor $C_C$ is a correction voltage capacitor. The capacitor $C_{CC}$ is a correction voltage coupling capacitor. The capacitor $C_H$ is the primary holding capacitor. The signal voltage from the signal IN node of the circuit 10 is applied to the storage node 12 of the holding capacitor $C_H$ through the primary sampling switch $S_S$. A signal OUT node is available through a stage-selecting enable switch $S_F$ at the output of a buffer amplifier 14 which has its input connected to the storage node 12. A correction feedback loop 16 couples the OUT node to the inverting input port (−) of a high speed, high performance operational amplifier 18. The output of the amplifier 18 is connected to its inverting input port (−) through a switch $S_A$ and is connected through a correction sampling switch $S_C$ to a correction voltage node 20, which is the common node of the correction capacitor $C_C$ and the coupling capacitor $C_{CC}$. The noninverting input port (+) of the operational amplifier 18 is connected to the output of an input buffer 22. The input of the buffer 22 is connected to the signal IN node through an input sampling switch $S_I$ and is also connected to an input holding capacitor $C_I$. The other side of the input capacitor $C_I$ is connected to ground.

In the timing diagram of FIG. 2, the ordinate represents the voltage and the abscissa represents time. Each of the switches $S_I$, $S_C$, $S_S$, $S_F$, $S_A$ is addressed by one of three separate switching pulse trains, $T_1$, $T_2$, $T_3$, $T_4$, from a switching pulse source which is not shown. The pulse trains, $T_1$, $T_2$, $T_3$, $T_4$, will be identified by the time interval during which the switch associated with it is in the closed condition. Thus, $T_1$ identifies the pulse train which closes the primary sampling switch $S_S$ for a time interval $T_1$; $T_2$ identifies the pulse train which closes the correction switch $S_C$ for a time interval $T_2$; $T_3$ identifies the pulse train which closes the input switch $S_I$ and the switch $S_A$ for a time interval $T_3$; and $T_4$ identifies the pulse train which operates the enable switch $S_F$ for a time period interval $T_4$. The lines $T_1$, $T_2$, $T_3$, $T_4$, associated respectively with the switches $S_S$, $S_C$, $S_I$, $S_F$, $S_A$ as indicated in the diagram, represent the high-low voltage level of the switching pulses of the trains. When the level is high, the switch is closed. When it is low, the switch is open. The enable switch $S_F$ is closed during the entire operation cycle interval $T_4$ of the circuit 10. It is understood that during this interval the enable switches $S_F$ of all the other stages of a filter bank of which it is a part would be open, thereby, virtually disabling the other stages.

Initially, the sampling switch $S_S$, the correction switch $S_C$, and the switch $S_A$ are closed during a first interval $T_1$, in which the voltage on the holding capacitor storage node 12 is tracking the voltage of the IN node through its sampling switch $S_S$. The closed switch $S_A$ prevents the amplifier 18 from operating with an open loop and becoming unstable during this period. At the end of this interval $T_1$, the sampling switch $S_S$ is opened, while the correction switch $S_C$ remains closed. A short delay time later, at the end of the interval $T_3$, the input switch $S_I$ and the switch $S_A$ are opened. Finally, at the end of the interval $T_2$, the correction switch $S_C$ is opened. The effect of this switching sequence on the signal at the OUT node of the circuit 10 will be discussed in more detail below.

When the sampling switch $S_S$ opens at the end of the first switch interval $T_1$, it introduces a voltage offset at the storage node 12 of the holding capacitor $C_H$. The correction switch $S_C$, however, remains closed during the remainder of the second interval $T_2$, so that a correction signal from the correction node 20 is coupled to the holding capacitor $C_H$ via the coupling capacitor $C_{CC}$. Due to the fact that the coupling capacitor $C_{CC}$ is considerably smaller than both the holding capacitor $C_H$ and the correction capacitor $C_C$, which are of roughly equal magnitude, the coupling of the correction capacitor $C_C$ to the holding capacitor $C_H$ is attenuated. As a result, when the correction switch $S_C$ opens at the end of the second switch interval $T_2$ and itself generates a charge feedthrough error, the effect of this error on the signal level at the storage node 12 is correspondingly attenuated and insignificant.

The circuit 24 shown in FIG. 3 is a modification of the circuit 10 which permits the use of an inverting operational amplifier 26 in place of the noninverting amplifier 18. This is desirable where the circuit is operating with a low voltage power supply such as, for example, between $+3$ volts and $-3$ volts for its active components. This can be understood by referring to the circuit 10 of FIG. 1. There is necessarily a d.c. (direct current) level shift between the input and the output of the input buffer 22. This forces the amplifier 18 to accept an input which is shifted toward its negative power supply voltage. The amplifier 18 is already required to have a relatively wide common mode range for its operation during the correction period beginning at the end of $T_3$. A shift of its input toward the negative supply voltage makes further demands on its common mode range and necessitates a relatively complex amplifier design for high speed operation. Shifting the voltage level of the buffer 22 output somehow to compensate for the inherent buffer voltage shift is not desirable, since the two buffers 22, 14 of the circuit 10 must closely match each other.

In the circuit 24 of FIG. 3, the amplifier 18 is replaced by an inverting operational amplifier 26 which has its noninverting input port $(+)$ grounded. The inverting input port $(-)$ is shunted to the output of the amplifier 26 through a switch $S_A$ which is closed during the switching period $T_1$. The inverting input port of the amplifier 26 is connected through an input holding capacitor C to a single-pole double-throw electronic switch $S_I$, which connects the other side of the capacitor C to the output of the input buffer 22 during the switching period $T_1$ and to the feedback loop 16 during the switching period $T_2$. Pursuant to conventional practice for representing toggle switches in drawings, the switch $S_I$ is shown in the position in which it would be when the control signal $T_3$ for it is high. When the control signal $T_3$ is low, the switch $S_I$ would be in its alternate position. During the $T_1$ tracking period for the circuit 24, a virtual ground is applied to the correction node 20. Then, for correction, the local feedback loop of the amplifier 26 is first opened by the switch $S_A$ in response to the $T_3$ pulse, so that the amplifier 26 side of the capacitor C is effectively isolated. The buffer 22 output is then disconnected from the amplifier 26 and the feedback loop 16 is connected to the amplifier input port by the toggling of the input switch $S_I$ in response to a version of the switching pulse $T_3$ which is slightly delayed in order to ensure that $S_A$ has first opened.

The various "ground" potential nodes of the circuits 10, 24 are at some reference potential, which need not necessarily be the same for all these nodes. In fact, in some instances it may be advantageous that they be at different levels.

The magnitude ratio of the coupling capacitor $C_{CC}$ to the storage capacitor $C_H$ is determined specifically for a particular circuit application. For a given signal bandwidth, the amount of correction depends on the performance characteristics of the operational amplifier and the amount of switching charge feedthrough that the switches $S_S$ and $S_C$ permit. Typical values of the ratio for telephony signals can be expected to be between 20 and 60.

The enable switch $S_F$ serves to select a particular sample-and-hold stage for activation where there are a plurality of such stages connected in a bank. Usually in such arrangements, the selection of a stage merely involves closing the enable switch $S_F$ for that stage and thereby also connecting the output port of the output buffer to whatever circuitry is to receive the signal from the bank. If the circuits 10 and 24 were to be used singly, this switch would be unnecessary.

In the circuit 10 of FIG. 1, the input switch $S_I$, the input capacitor $C_I$, and the buffer input 22 form a simple sample-and-hold circuit. The purpose of this circuit is to provide the amplifier 18 with discrete signal levels which don't change during the course of the correction period $T_2$. This leads to better accuracy at high frequencies. However, at frequencies below audio range, this feature is not necessary, and the input signal can then be fed directly to the input port of the operational amplifier 18.

What is claimed is:
1. A sample-and-hold circuit apparatus, comprising:
first, second and third capacitors connected in series between two reference voltage points, the common node of the first and second capacitors forming a primary, signal node and the common node of the second and third capacitors forming a secondary, correction node;
a feedback buffer having an input port and an output port, the input port being connected to the signal node;

an amplifier having an inverting and a noninverting input and an output port, the output port being selectively connected to the correction node through a correction sampling switch;

means for selectively connecting the output port of the amplifier to one of its input ports;

means for selectively connecting an input signal to the signal node through a signal sampling switch, and means for selectively coupling the output port of the output buffer to the correction node through the amplifier.

2. The apparatus defined in claim 1 comprising:

an input sampling switch having one side adapted to receive the input signal and having its other side connected to one side of an input holding capacitor, the other side of the input holding capacitor being connected to a reference potential, and an input buffer, the input port of the input buffer being connected to the one side of the input holding capacitor and the output of the input buffer being connected to the noninverting input port of the amplifier.

3. The apparatus defined in claim 1 comprising:

an input buffer having its input adapted to receive an input signal and also connected to the signal node through the signal sampling switch;

an input holding capacitor connected at one side to the inverting input port of the amplifier;

means for selectively connecting the other side of the input holding capacitor alternately to the output port of the input buffer and to the output port of the feedback buffer, and means for selectively connecting the output port of the amplifier to its inverting input port.

* * * * *